United States Patent [19]

Shinkawa

[11] Patent Number: 4,602,217

[45] Date of Patent: Jul. 22, 1986

[54] FM DEMODULATOR CAPABLE OF SHIFTING DEMODULATION-BAND CENTER FREQUENCY

[75] Inventor: Keiro Shinkawa, Yokohama, Japan

[73] Assignee: Hitachi, Ltd., Tokyo, Japan

[21] Appl. No.: 671,876

[22] Filed: Nov. 15, 1984

[30] Foreign Application Priority Data

Nov. 18, 1983 [JP] Japan .................................. 58-216208
Nov. 18, 1983 [JP] Japan .................................. 58-216209
Mar. 30, 1984 [JP] Japan .................................. 59-60650

[51] Int. Cl.[4] ............................................. H03D 3/00
[52] U.S. Cl. ...................................... 329/122; 329/50; 331/17
[58] Field of Search ............... 329/50, 122, 136; 331/17; 455/214, 337

[56] References Cited

U.S. PATENT DOCUMENTS 4,479,091 10/1984 Yoshisato ............................ 329/122
4,494,080 1/1985 Call ...................................... 331/17 X

FOREIGN PATENT DOCUMENTS 0152333 11/1981 Japan .................................... 331/17

Primary Examiner—James B. Mullins
Assistant Examiner—Robert J. Pascal
Attorney, Agent, or Firm—Antonelli, Terry & Wands

[57] ABSTRACT

In an FM demodulator of the phase locked loop system wherein a closed loop is formed by a phase detector, an amplifier, a loop filter, and a voltage controlled oscillator, a part of the amplifier is formed by a differential amplifying circuit which has a constant current source and is driven by a constant current. The center frequency of the frequency demodulation slope of the constant current source is changed by changing the current from the constant current source in response to the signal which was frequency demodulated by the phase locked loop. Further, a low-pass filter having the pass band of the frequency band of the signal to be modulated is provided in the path of the system from the differential amplifying circuit to the constant current source.

20 Claims, 19 Drawing Figures

FM DEMODULATOR CAPABLE OF SHIFTING DEMODULATION-BAND CENTER FREQUENCY

BACKGROUND OF THE INVENTION

The present invention relates to an arrangement of an FM demodulator to demodulate a frequency modulated signal.

In the television broadcast using a geostationary satellite, a frequency modulated (FM) television signal is used. In a receiver for receiving this broadcast, the television signal is demodulated from a weak radio wave which is transmitted from the satellite; therefore, a PLL (phase locked loop) FM demodulator having excellent characteristic for weak electric fields is often used. FIG. 1 shows an arrangement of an ordinary PLL-FM demodulator. A frequency modulated signal which was inputted through an input terminal 1 is demodulated by a PLL-FM demodulator consisting of the closed loop which is constituted by a phase detector 2, an amplifier 3, a loop filter 4, and a voltage controlled oscillator (VCO) 5. An input line to the voltage controlled oscillator 5 is branched, to pick up the demodulated television signal from an output terminal 6. In this FM demodulator, the beat component which is generated from the phase detector 2 and which has the frequency corresponding to the difference between the input signal from the terminal 1 and the signal from the voltage controlled oscillator 5 is amplified by the amplifier 3; the phase and gain are adjusted by the loop filter 4; thereafter, the output signal from the loop filter 4 is applied to an oscillation frequency control terminal of the voltage controlled oscillator 5. The television signal as the original signal of the input FM signal is generated at the oscillation frequency control input terminal of the voltage controlled oscillator 5 due to the function of the closed loop which sets the frequency of the beat component to 0, and the closed loop serves as the FM demodulator. Therefore, the demodulation band of this FM demodulator is determined by the gain and phase characteristics which are formed by the amplifier 3 and loop filter 4 in the closed loop and can be set to the minimum necessary band; therefore, the demodulation characteristic when the electric field is weak is excellent.

FIG. 2 shows a demodulation band characteristic of the ordinary PLL-FM demodulator shown in FIG. 1. In case of satisfying the conditions such that the sum of the phase error between the input signal and a reference frequency $f_0$ of the voltage controlled oscillator 5 and the phase error in the closed loop is $\pm 90°$ or less and that the gain of the loop is greater than 1, the PLL circuit shown in FIG. 1 is synchronized, so that the oscillation frequency from the voltage controlled oscillator 5 is shifted in accordance with the input signal frequency. Therefore, as an output of the FM demodulator, the voltage applied to the voltage controlled oscillator 5 and the DC voltage proportional to the difference between the reference frequency $f_0$ and the frequency of the input signal along characteristic line 7 of the oscillation frequency are generated, so that the function as the FM demodulator is obtained. The frequency width in this synchronous region corresponds to the frequency demodulation band. From the above-mentioned loop conditions of the PLL, it will be appreciated that the phase error in the closed loop becomes small with an increase in loop gain, so that the frequency demodulation band becomes wide. In addition, even in the case where the gains are the same, the frequency demodulation band becomes wide as the phase distortion in the closed loop becomes small.

On the other hand, as the characteristic which is inherent to the FM demodulator, there is a threshold characteristic whereby a demodulation S/N (signal-to-noise) ratio suddenly deteriorates as a C/N (carrier-to-noise) ratio of the input FM signal becomes low. This threshold is determined by the amount of noises to be demodulated. As the amount of noises to be demodulated is less, that is, as the band width of the demodulation noises is narrow, the threshold level moves to a lower C/N ratio. In order to make the band width of the demodulation noises narrow, it is necessary to set the gain characteristic of the PLL to a narrow band.

As described above, it is desirable for the PLL-FM demodulator to have the characteristic such that the gain is large and the demodulation band is wide at the video frequency and the gain suddenly becomes small and the demodulation band is narrow at a frequency higher than the video frequency for improvement in the threshold value.

The gain characteristic of the closed loop of the PLL-FM demodulator shown in FIG. 1 is determined by the loop filter 4. In case of using a lag-lead filter having a small phase distortion as the loop filter 4, a gentle attenuation characteristic having an attenuation ratio of 6 dB at the double frequency is shown. Therefore, when the demodulation band is ensured at the video frequency in case of demodulating the FM signal having a large frequency deviation due to the video signal, there is a drawback such that the noise band becomes wide and the threshold level deteriorates. On the other hand there is another drawback such that when the threshold level is preferably set, the demodulation band at the video frequency becomes narrow, so that the demodulation cannot be performed. When another narrow band filter than the lag-lead filter is used as the loop filter 4, the phase distortion in the closed loop increases, so that even if the gain is increased, the demodulation band will not become wide.

SUMMARY OF THE INVENTION

It is an object of the present invention to eliminate the foregoing drawbacks in the PLL-FM demodulator and to provide an FM demodulator in which the gain band in the loop is narrowed and a good threshold level is derived irrespective of the magnitude of the video frequency deviation by a simple circuit arrangement.

In this invention, by use of an arrangement whereby the center frequency of the demodulation band of the demodulator is shifted in response to the demodulation signal, the band characteristic in the demodulation loop is narrowed and the threshold level is improved by a simple arrangement.

BRIEF DESCRIPTION OF THE DRAWINGS

The features of the invention will be apparent from the following description taken in conjunction with the accompanying drawings, in which:

FIGS. 17, 18 and 10 are arrangement diagrams showing further other embodiments of the invention.

DESCRIPTION OF THE PREFERRED EMBODIMENTS

Figure 1:
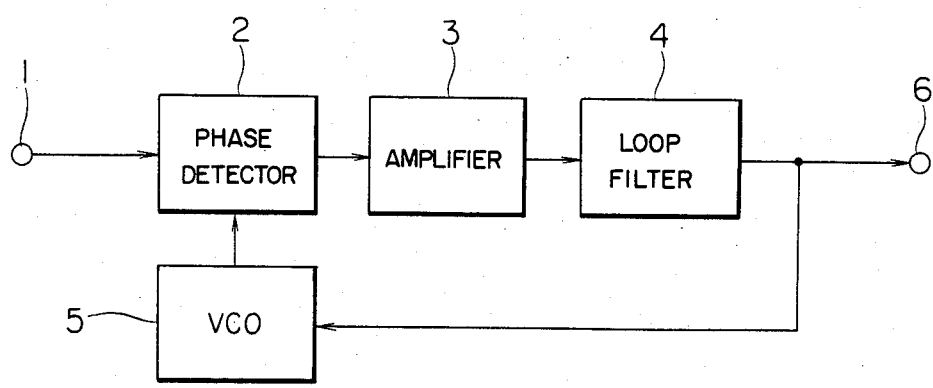
FIG. 1 is a diagram showing an arrangement of an ordinary PLL-FM demodulator.
Figure 2:
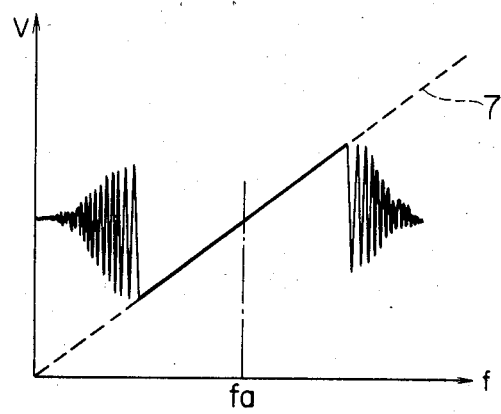
FIG. 2 is a diagram showing the characteristic of the PLL-FM demodulator shown in FIG. 1.
Figure 3:
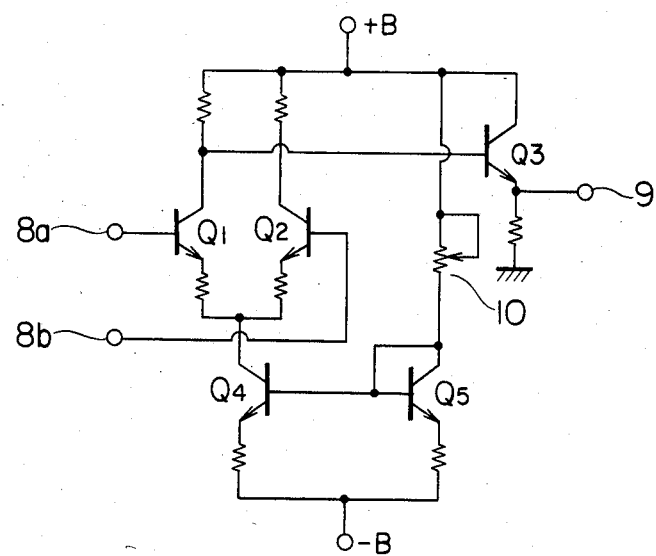
FIGS. 3 and 4 are a circuit diagram and a characteristic diagram for explaining the principle of the present invention, respectively.
Figure 4:
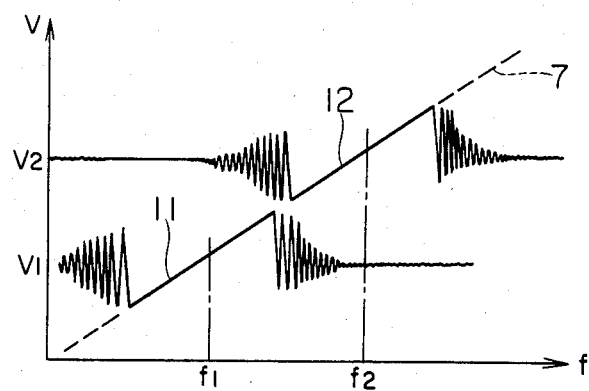

The present invention will now be described in detail hereinbelow with respect to embodiments shown in the drawings. FIGS. 3 and 4 show diagrams for explaining the principle of the present invention. FIG. 3 shows a differential amplifier which is constituted by transistors $Q_1$ and $Q_2$ and which has a constant current source consisting of a mirror circuit of transistors $Q_4$ and $Q_5$. It is assumed that this differential amplifier is used as a part of the amplifier 3 in the PLL-FM demodulator shown in FIG. 1; a base 8a of the transistor $Q_1$ and a base 8b of the transistor $Q_2$ are used as balanced signal inputs; a signal is outputted from a collector of the transistor $Q_1$ through the transistor $Q_3$; and an output terminal 9 of the transistor $Q_3$ is connected to the loop filter 4. When the current from the constant current source is changed by a variable resistor 10, as shown in FIG. 4, a demodulation characteristic curve 11 at a center frequency $f_1$ changes to a demodulation characteristic curve 12 at a center frequency $f_2$ along the oscillation frequency characteristic line 7 regarding the voltage applied to the voltage controlled oscillator 5 and at this time, the loop gain and phase are not changed. Therefore, the demodulation bands of the demodulation characteristics 11 and 12 are the same.

Figure 5:
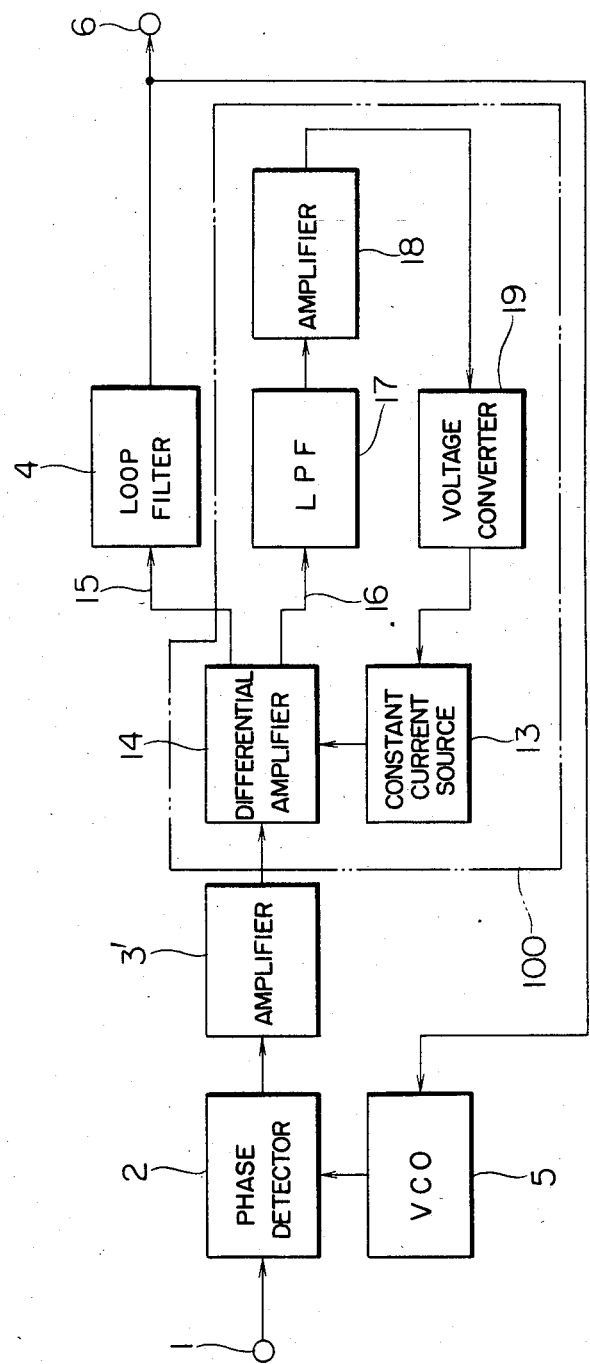
FIG. 5 is an arrangement diagram showing an embodiment of an FM demodulator according to the present invention.

FIG. 5 shows an example of an FM demodulator of the present invention. A differential amplifier at the post stage of an amplifier 3' in the PLL-FM demodulator. One output 15 of the differential amplifier 14 is connected to the loop filter 4. The other output 16 is applied to the constant current source 13 through a low-pass filter (LPF) 17, an amplifier 18 and a voltage converter 19. A current from the constant current source 13 is changed using a demodulation signal from the differential amplifier 14. A demodulation band shifting circuit 100 is constituted by the constant current source 13, differential amplifier 14, low-pass filter 17, amplifier 18, and voltage converter 19. The frequency characteristic of the low-pass filter 17 is set to the narrow band by the loop filter 4 in the PLL. The LPF 17 may be arranged at any location in the system from the output 16 of the differential amplifier 14 to the constant current source 13. In this arrangement, in the demodulation signal of the PLL-FM demodulator, with respect to the demodulation signal component in the pass band of the low-pass filter 17, the current from the constant current source 13 is changed and the frequency demodulation band is shifted to obtain the wide band demodulation characteristic. On the other hand, with regard to the demodulation signal component in the blocking band of the low pass filter 17, the filter 17 does not change the current from the constant current source 13, so that a conventional demodulation band which is determined by the amplifier 3', differential amplifier 14 and loop filter 4 is derived. In the case where the video signal band is selected as the pass band of the low-pass filter 17, the frequency demodulation band for the video signal is widened, so that the gains of the amplifier 3 and differential amplifier 14 can be reduced and the threshold level can be improved by narrowing the band of the noises which are demodulated.

Figure 6:
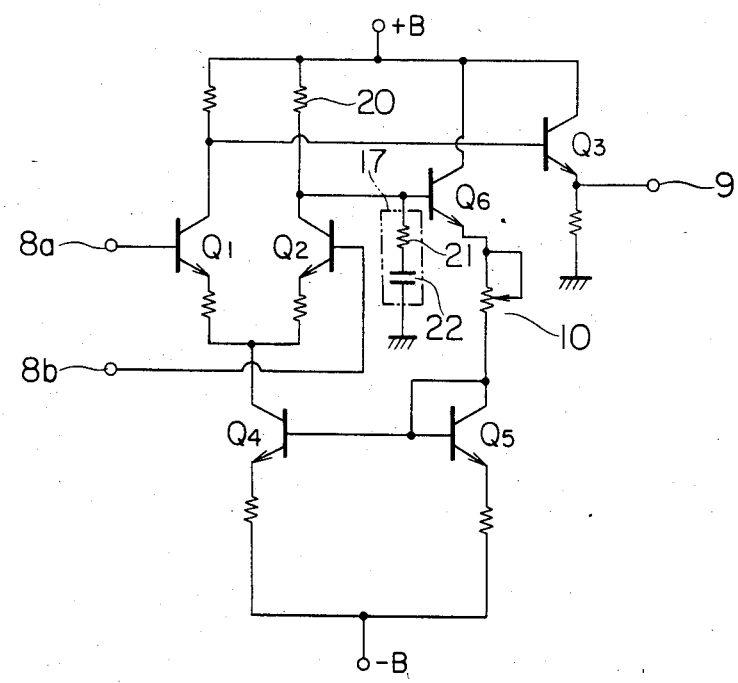
FIG. 6 is an electrical wiring diagram showing an example of a demodulation band shifting circuit for use in the invention.

FIG. 6 shows an embodiment of the demodulation band shifting circuit 100 for controlling the demodulation band shift of the FM demodulator of the invention shown in FIG. 5. The demodulation signal is derived from a collector of the transistor $Q_2$ of the differential amplifier 14 which has no relation to the PLL closed loop by a transistor $Q_6$ through the low-pass filter (17 in FIG. 6) of the lag-lead type consisting of resistors 20 and 21 and a capacitor 22. The constant current source for the differential amplifier is driven by the demodulation signal voltage which passed through the low-pass filter. Thus, as the frequency of the input FM signal becomes high, the collector voltage of the transistor $Q_1$ becomes high; the collector voltage of the transistor $Q_2$ becomes low; the base voltage of the transistor $Q_4$ of the constant current source becomes low; the current flowing through the transistor $Q_4$ decreases; the demodulation band is shifted to the side of a high frequency; the collector voltage of the transistor $Q_2$ is controlled so as to always become a constant voltage; and the demodulation band is shifted in accordance with the frequency of the input FM signal. This demodulation band shifting circuit 100 is independent of the closed loop of the PLL, so that even if the loop gain of the band shifting circuit 100 is set to be large, the control sensitivity can be improved without affecting the PLL-FM demodulation characteristic. As an example, this purpose can be easily realized by enlarging the collector resistance 20 of the transistor $Q_2$.

Figure 7:
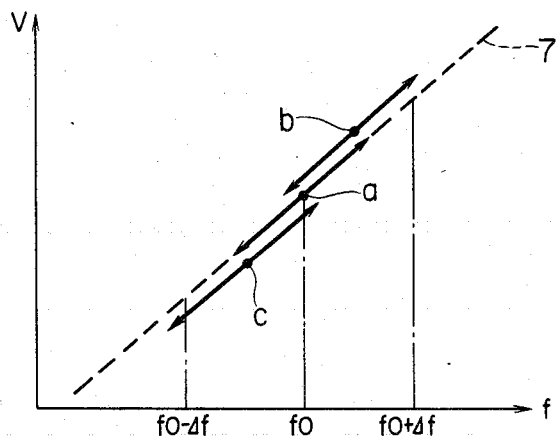
FIGS. 7 and 8 are characteristic diagrams for explaining the operation of the invention shown in FIG. 5.

The operations of these circuits are shown in FIG. 7. When the center frequency $f_0$ of the input FM signal is inputted, the demodulation band indicated as having the center frequency $f_0$ is obtained. When the input signal is deviated by $\Delta f$, the control for shifting the band is performed so as to make the collector voltage of the transistor $Q_2$ constant. Thus, the demodulation band becomes as indicated at b whereby the center of the demodulation band was shifted by only ½ of the $\Delta f$. On the other hand, when the input signal is deviated by $-\Delta f$, the demodulation band similarly becomes as indicated at c whereby the frequency was lowered by only ½ of the $\Delta f$. Now, assuming that the maximum frequency deviation $2 \cdot \Delta f$ is 17 MHz, the demodulation band before the band is shifted may be the half of it, that is, 8.5 MHz.

This point will be discussed with respect to the loop gain. In the band shifting circuit 100 of FIG. 6, when it is assumed that a gain of the differential amplifier 14 is $A_1$ and a gain of the band shifting loop from the transistor $Q_2$ to the transistor $Q_4$ is $A_2$, a gain $A_0$ of this circuit will be represented by $$A_0 = A_1 \left( 1 + \frac{A_2}{A_2 + 1} \right)$$

When $A_2$ is a large value, the gain $A_0$ of the circuit is twice the gain $A_1$ of the differential amplifier 14. When $A_2$ has a small value, $A_0$ equals $A_1$.

Figure 8:
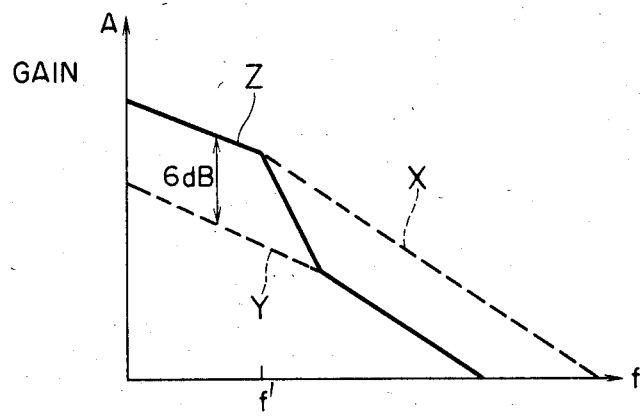

FIG. 8 shows the relation among those gains. At a gain A of the PLL, in the case where the band shift to obtain the frequency demodulation band having the highest video frequency f' of 17 MHz is not performed, when it is assumed that a characteristic curve of the PLL closed loop is indicated by X and that a characteristic curve of the PLL closed loop in the case where the band shift such that the gain is set to be lower by 6 dB than the characteristic curve X is not performed is indicated by Y, a characteristic curve indicated by a solid line Z is obtained by use of the present invention, so that the necessary gain is derived at the highest video frequency f', while the gain is reduced by 6 dB at frequencies over f'. Therefore, the noise band is narrowed and the threshold level is improved. This increase in gain at low frequencies presents the band shift effect and also the band shifting circuit 100 constitutes a loop; consequently, an increase in phase error due to the addition of the band shifting loop can be made small by increasing the gain of the band shifting loop.

Figure 9:
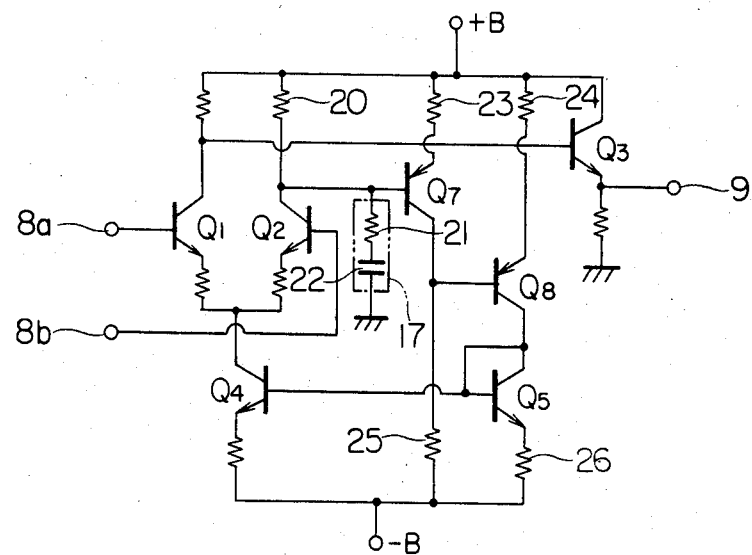
FIGS. 9, 10 and 11 are arrangement diagrams showing modified forms of the demodulation band shifting circuit for use in the embodiment of the invention shown in FIG. 5.

FIG. 9 shows another embodiment of the band shifting circuit 100 whereby the gain of the band shifting loop is increased. An amplifying circuit consisting of PNP transistors $Q_7$ and $Q_8$ is constituted between the low-pass filter 17 at the output of the transistor $Q_2$ of the differential amplifying circuit and the current source transistor $Q_4$. The gain can be arbitrarily set by resistors 23, 24, 25, and 26, thereby enabling the increase in phase error of the PLL due to the addition of the band shifting loop to be minimized.

Figure 10:
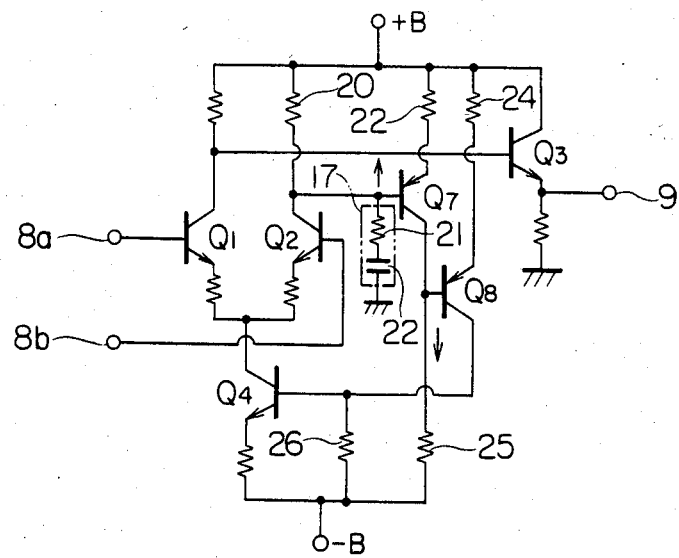
Figure 11:
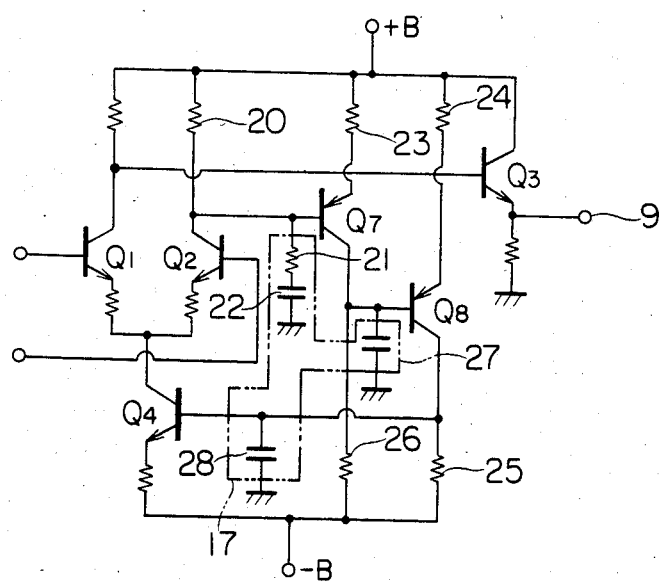

FIGS. 10 and 11 show other embodiments of the band shifting circuit 100 of the invention. As shown in FIG. 10, a current variation due to a temperature change of the current source transistor $Q_4$ is suppressed with the aid of function of the band shift control loop, so that a transistor $Q_5$ of the mirror circuit can be removed. On one hand, the constitution of the low-pass filter 17 is not limited to the resistor 21 and capacitor 22, but it may be an arrangement using a capacitor 27 and-/or 28. That is, it may be either constitution wherein only one of these elements is used, or constitution wherein all of them are used. In this case, it is obvious that such an element may be arranged at any location in the band shifting loop. The band shifting loop which makes the demodulation band variable is independent of the closed loop for PLL-FM demodulation and the stable operation is obtained. Also, the band characteristic of the closed loop for the PLL-FM demodulation does not need the wide band operation, so that such a loop can be easily constituted. Further, by use of the FM demodulator of the invention as a part of the heterodyne receiver, less deterioration of the demodulation signal is obtained since the center frequency of the demodulator is automatically shifted even if the center frequency of the input signal to the FM demodulator is changed due to a variation in local oscillation frequency of the heterodyne receiver.

In addition, it is necessary to more largely shift the demodulation band in case of receiving an FM signal having a large frequency variation at low frequencies.

Figure 12:
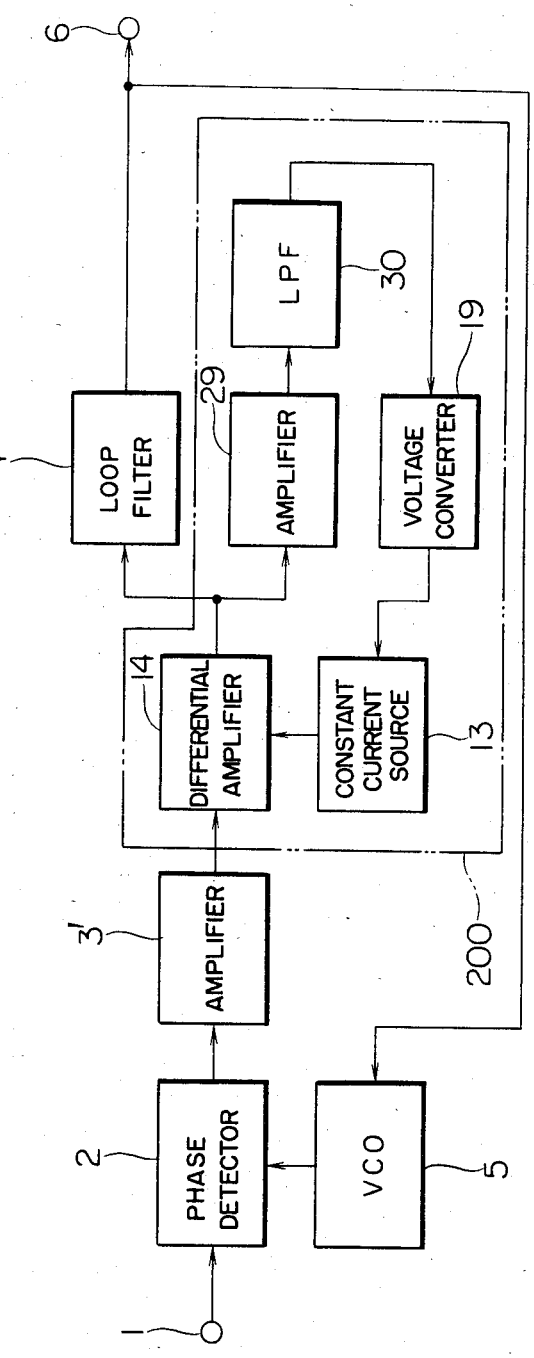
FIG. 12 is an arrangement diagram showing another embodiment of the invention.

FIG. 12 shows another embodiment of an FM demodulator of the invention. The differential amplifier 14 having the constant current source 13 is arranged at the post stage of the amplifier 3' of the PLL-FM demodulator. The output of the differential amplifier 14 is branched. One output is connected to the loop filter 4 and the other is connected to the constant current source 13 through an amplifier 29, a low-pass filter 30 and the voltage converter 19. The current from the constant current source 13 is changed using the demodulation signal of the output from the differential amplifier 14, thereby shifting the center frequency of the demodulation band. The low-pass filter 30 may be arranged at the post stage of the voltage converter 19. A demodulation band shifting circuit 200 is constituted by the constant current source 13, differential amplifier 14, voltage converter 19, amplifier 29, and low-pass filter 30.

Figure 13:
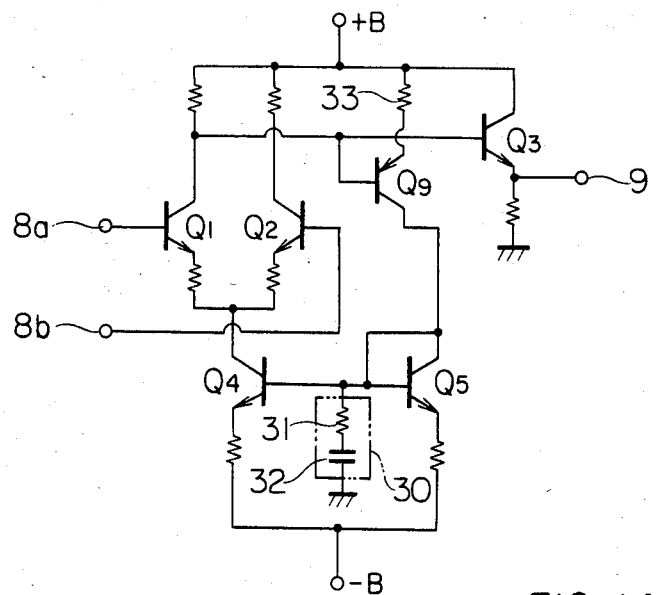
FIGS. 13 and 14 are electrical wiring diagrams showing an example of the demodulation band shifting circuit for use in the invention.

FIG. 13 shows an embodiment of the band shifting circuit 200 for shifting the demodulation band of the FM demodulator of the invention. The output of the PLL closed loop of the differential amplifier 14 is branched and derived by a PNP transistor $Q_9$. A collector of the transistor $Q_9$ is connected to a collector of the transistor $Q_5$. An emitter of the transistor $Q_9$ is connected to a positive polarity power source through a resistor 33. Due to this, when the frequency of the input FM signal becomes high, the collector voltage of the transistor $Q_1$ becomes high; the current flowing through the transistor $Q_9$ decreases; the base voltage of the transistor $Q_4$ becomes low; the current flowing through the transistor $Q_4$ is reduced; and the frequency demodulation band is shifted to the side of a high frequency. It will be obviously understood that the above-described demodulation band shift is performed with respect to only the signal within the pass band of the low-pass filter 30 due to the function of the low-pass filter 30 consisting of a resistor 31 and a capacitor 32.

Figure 14:
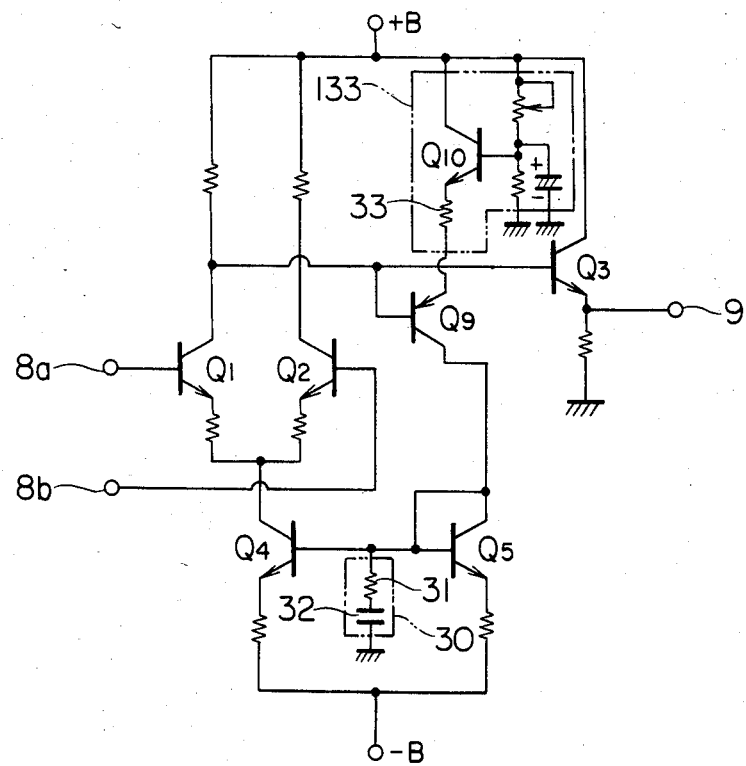
Figure 15:
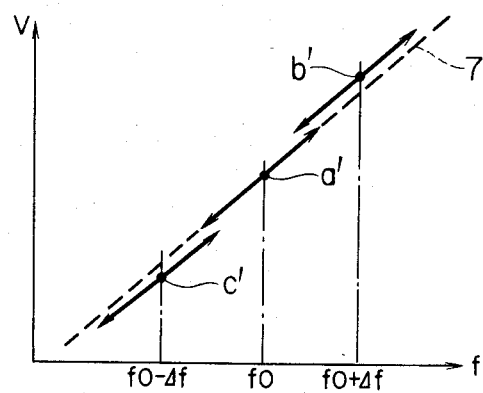
FIGS. 15 and 16 are characteristic diagrams for explaining the operation of the invention shown in FIG. 12.
Figure 16:
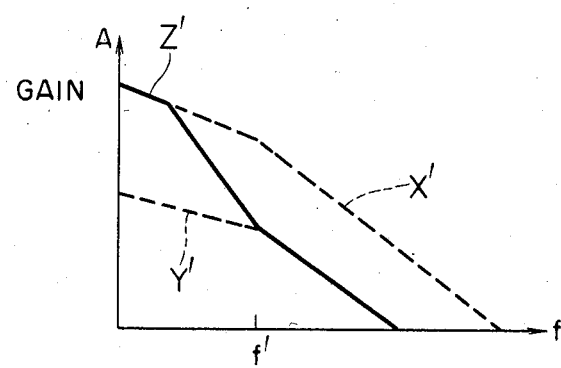

The sensitivity upon shifting of the demodulation band is determined by a magnitude of the emitter resistor 33 of the transistor $Q_9$. Although the shift width increases with a decrease in value of the resistor 33, the DC balance of the differential amplifier is obtained at the center frequency of the input FM signal in this arrangement, so that the resistor 33 cannot be set to a small value. Therefore, as shown in FIG. 14, by constituting a constant voltage source 133 including a transistor $Q_{10}$ on the power source side of the resistor, the value of the resistor 33 can be made small, thereby enabling the demodulation band to be largely shifted. When the value of the resistor 33 is selected so that the collector voltages of the transistors $Q_1$ and $Q_2$ are always equal, the demodulation band is shifted such that the input FM signal is always located at the center of the demodulation band. This operation is shown in FIG. 15. When the center frequency $f_0$ of the input FM signal is inputted, the demodulation band becomes as indicated at a' having the center frequency $f_0$ since the DC balance of the differential amplifier is ensured. When the input signal is deviated by $\Delta f$, the output voltage of the transistor $Q_1$ of the differential amplifier increases; however, the current of the constant current source decreases and the collector voltage of the transistor $Q_2$ becomes equal to the collector voltage of the transistor $Q_1$. Thus, the differential amplifier is well balanced due to this voltage, so that the demodulation band becomes as shown at b′ having the center frequency of $(f_0+\Delta f)$. When the input signal is deviated by the frequency of $-\Delta f$, the demodulation band similarly becomes as shown at c′ having the center frequency of $(f_0-\Delta f)$. In this case, since the demodulation band is triple the demodulation band in the case where the band shift is not performed, the gain of the PLL closed loop can be lowered to $\frac{1}{3}$ (about 10 dB) of that in the case where the band shift is not performed, so that the threshold is improved. Since the demodulation band shifting circuit 200 does not constitute a loop as shown in FIG. 16, a loop gain characteristic Z′ when the demodulation band is shifted presents the characteristic of the narrow band filter 30 which are constituted in the demodulation band shifting circuit 200 and is effective for the demodulation of the FM signal having a large frequency deviation at low frequencies.

This allows the noise band width in the closed loop to be also made small, thereby improving the threshold level. Further, by use of the FM demodulator of the invention as the demodulating section of the heterodyne receiver, the demodulation signal does not deteriorate since the demodulation is always performed at the center frequency of the demodulation band even if the center frequency of the input signal to the FM demodulator is changed due to the variation in local oscillating frequency of the heterodyne receiver.

Figure 17:
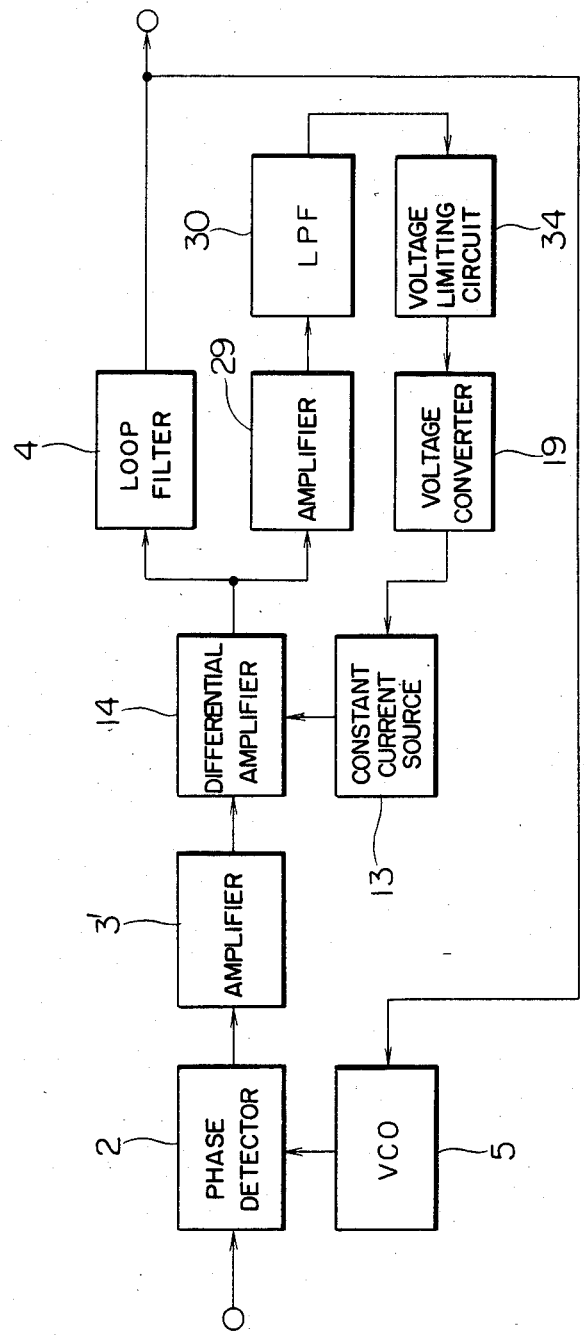

The use of this characteristic makes it possible to constitute an AFC circuit by narrowing the narrow band filter 30 of the demodulation band shifting circuit 200 to nearly a direct current. In such a case, as shown in FIG. 17, the erroneous operation of the AFC for the demodulation band shift can be prevented by providing a voltage limiting circuit 34 at the post stage of the amplifier 29.

Figure 18:
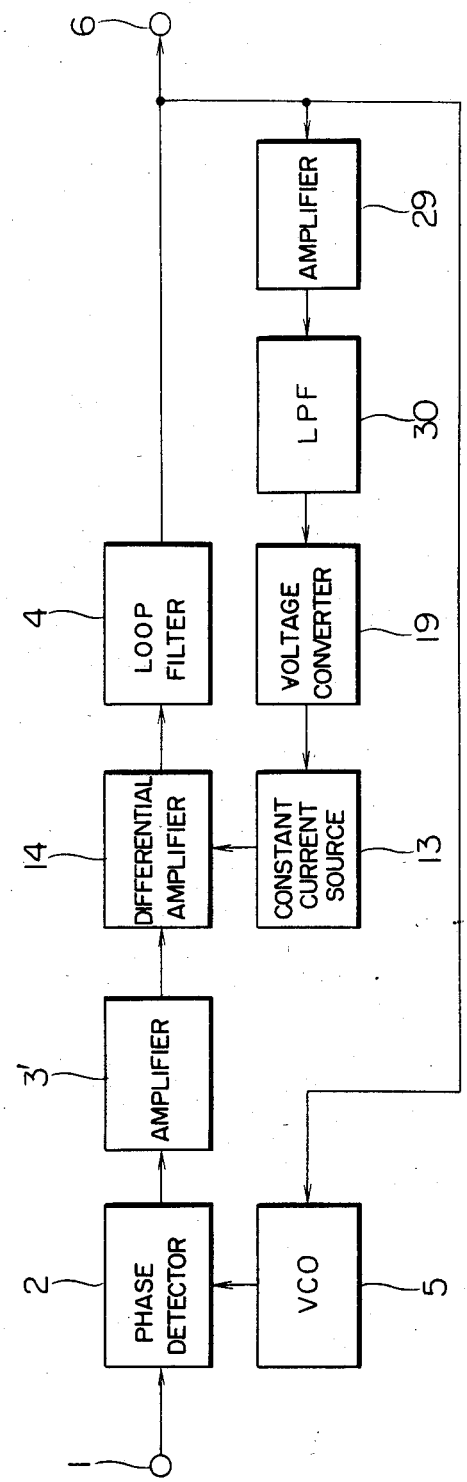
Figure 19:
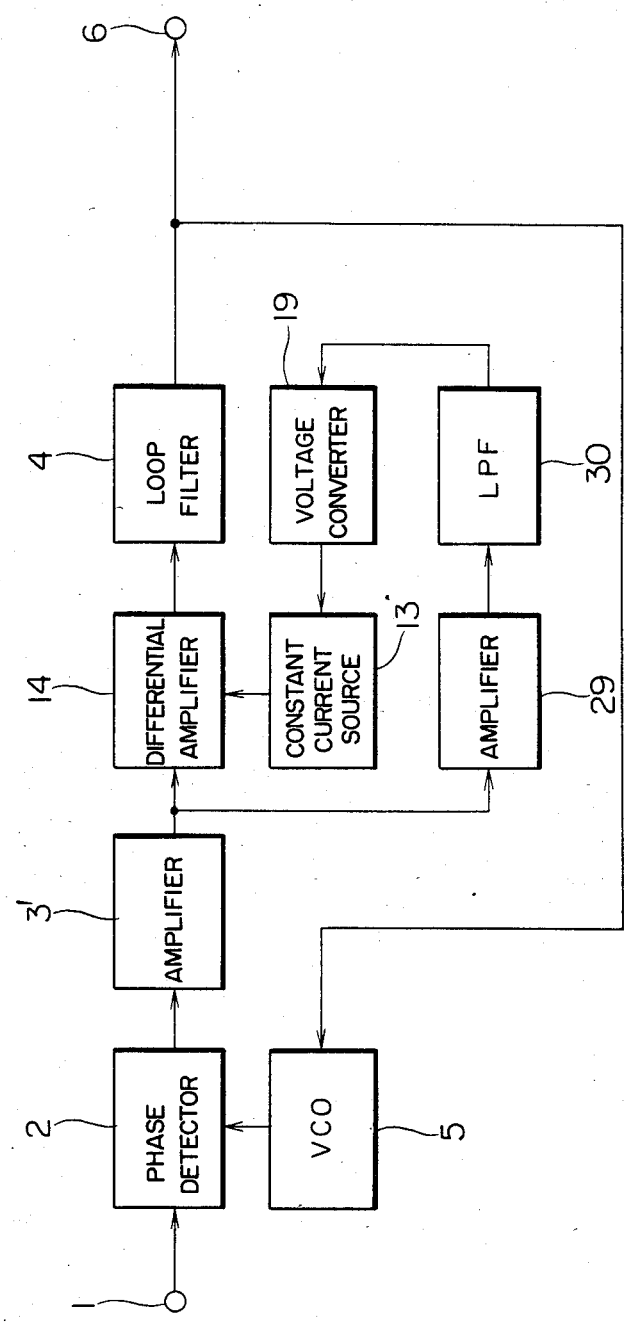

Although the invention has been described with respect to the embodiment of FIG. 12 whereby the output from the differential amplifier 14 is branched and the demodulation signal is used, the invention is not limited to this arrangement. The demodulation signal to drive the constant current source 13 for the differential amplifier 14 may have the polarity such as to reduce the current from the constant current source when the output voltage of the differential amplifier increases. It will be also obviously understood that it is possible to use a signal of the output from the PLL-FM demodulator as shown in FIG. 18 or to use a signal branched from the amplifying circuit at the front stage of the differential amplifier as shown in FIG. 19.

On the other hand, although the differential amplifier is arranged at the front stage of the loop filter, the invention is not limited to this location. Obviously, it is also possible to arrange the differential amplifier at the intermediate portion or at the first stage of the amplifier in the closed loop.

As described above, in the invention, the center frequency of the demodulation band of the PLL-FM demodulator is shifted in response to the demodulation signal. Therefore, there are effects such that the FM signal having a large video frequency deviation can be demodulated by a simple constitution, good demodulation is performed even with regard to the deviation in center frequency of the input FM signal, and the threshold level is remarkably improved.

I claim:

1. An FM demodulator comprising:

a phase locked loop which is formed by a phase detector to which a frequency modulated signal is inputted, an amplifier, a loop filter, and a voltage controlled oscillator; and a demodulation band shifting circuit, connected to said phase locked loop, for changing a voltage in said loop in response to the frequency demodulated in said loop, thereby changing the center frequency of a frequency demodulation slope of the loop, said demodulation band shifting circuit including a differential amplifying circuit connected to a constant current source so as to be driven by a constant current.

2. An FM demodulator according to claim 1, wherein one output of a pair of differential outputs from said differential amplifier is supplied to said phase locked loop, and said demodulation band shifting circuit further includes current control means responsive to the frequency demodulated signal produced from the other output of the differential amplifying circuit for controlling the current produced by said constant current source.

3. An FM demodulator according to claim 3, wherein said current control means includes an amplifying circuit provided in a path from the output of said differential amplifying circuit to said constant current source.

4. An FM demodulator according to claim 3, wherein said current control means includes a low-pass filter provided in a path from said differential amplifying circuit to said constant current source.

5. An FM demodulator according to claim 4, wherein a low-pass filter is provided in a path of the system from said differential amplifying circuit to said constant current source.

6. An FM demodulator according to claim 1, further including means responsive to said frequency demodulated signal derived from a point on the closed loop of said phase locked loop for controlling the current supplied from said constant current source.

7. An FM demodulator according to claim 6, wherein said current controlling means includes an amplifying circuit provided in a path from said point on the closed loop to said constant current source.

8. An FM demodulator according to claim 7, wherein a voltage limiting circuit is provided following the amplifying circuit in said path from said point on the closed loop to the constant current source.

9. An FM demodulator according to claim 6, wherein a low-pass filter is provided in a path from said point on the closed loop to the constant current source.

10. An FM demodulator according to claim 7, wherein a low-pass filter is provided in said path from said point on the closed loop to the constant current source.

11. An FM demodulator according to claim 7, wherein the frequency demodulated signal to control the current from said constant current source is derived from the output of said differential amplifying circuit which output is used in the closed phase locked loop.

12. A phase locked loop FM demodulator comprising:

(a) a phase locked loop circuit including:

(1) a phase detector responsive to a frequency modulated signal, (2) amplifying means coupled to said phase detector and having a first amplifier through which flows a variable current, (3) a loop filter coupled to said amplifying means and having a predetermined frequency characteristic, and (4) a voltage controlled oscillator coupled to said phase detector and said loop filter;

(b) a low-pass filter coupled to said amplifying means and having a frequency characteristic which is set to be narrower than that of said loop filter; and (c) current varying means coupled between said low-pass filter and said amplifying means for varying the current flowing through the amplifier of said amplifying means in accordance with an output signal of said low-pass filter.

13. A phase locked loop FM demodulator according to claim 12, wherein the amplifier of said amplifying means is a differential amplifier having a pair of first and second output terminals, the first output terminal being connected to said loop filter and the second output terminal being connected to said low-pass filter.

14. A phase locked loop FM demodulator according to claim 13, wherein said current varying means includes a voltage converter connected to said low-pass filter and a constant current source connected to the voltage converter, said voltage converter converting an output signal of said low-pass filter into a value suitable for the constant current source, and a current value from the constant current source being determined by an output signal of said voltage converter.

15. A phase locked loop FM demodulator according to claim 12, wherein a second amplifier is connected between said low-pass filter and said current varying means.

16. A phase locked loop FM demodulator according to claim 12, wherein a second amplifier is connected between said amplifying means and said low-pass filter.

17. A phase locked loop FM demodulator comprising:

(a) a phase locked loop circuit including:
(1) a phase detector responsive to a frequency modulated signal,
(2) amplifying means coupled to said phase detector and having a first amplifier through which flows a variable current,
(3) a loop filter coupled to said amplifying means and having a predetermined frequency characteristic, and
(4) a voltage controlled oscillator coupled between said phase detector and said loop filter;

(b) a low-pass filter coupled to said loop filter and having a frequency characteristic which is narrower than that of said loop filter; and (c) current varying means coupled between said low-pass filter means and said amplifying means for varying a value of the current flowing through the amplifier of said amplifying means in accordance with an output signal of said low-pass filter.

18. A phase locked loop FM demodulator according to claim 17, wherein the amplifier of said amplifying means is a differential amplifier having a pair of first and second output terminals, the first output terminal being connected to said loop filter and the second output terminal being connected to said low-pass filter.

19. A phase locked loop FM demodulator according to claim 17, wherein said current varying means includes a voltage converter connected to said low-pass filter and a constant current source connected to the voltage converter, said voltage converter converting an output signal of said low-pass filter into a value suitable for the constant current source and a current value from the constant current source being determined by an output signal of said voltage converter.

20. A phase locked loop FM demodulator according to claim 17, wherein a second amplifier is connected between said loop filter and said low-pass filter.

* * * * *